United States Patent
Yu et al.

(10) Patent No.: US 9,431,342 B2
(45) Date of Patent: Aug. 30, 2016

(54) STAGGERED VIA REDISTRIBUTION LAYER (RDL) FOR A PACKAGE AND A METHOD FOR FORMING THE SAME

(71) Applicant: Taiwan Semiconductor Manufacturing Company, Ltd., Hsin-Chu (TW)

(72) Inventors: Chen-Hua Yu, Hsin-Chu (TW); Chung-Shi Liu, Hsin-Chu (TW); Hung-Jui Kuo, Hsin-Chu (TW)

(73) Assignee: Taiwan Semiconductor Manufacturing Company, Ltd., Hsin-Chu (TW)

(*) Notice: Subject to any disclaimer, the term of this patent is extended or adjusted under 35 U.S.C. 154(b) by 0 days.

(21) Appl. No.: 14/852,092

(22) Filed: Sep. 11, 2015

(65) Prior Publication Data

US 2015/0380350 A1     Dec. 31, 2015

Related U.S. Application Data

(63) Continuation of application No. 14/143,582, filed on Dec. 30, 2013, now Pat. No. 9,165,885.

(51) Int. Cl.
| | |
|---|---|
| *H01L 23/48* | (2006.01) |
| *H01L 23/52* | (2006.01) |
| *H01L 29/40* | (2006.01) |
| *H01L 23/528* | (2006.01) |
| *H01L 21/768* | (2006.01) |
| *H01L 23/522* | (2006.01) |
| *H01L 23/532* | (2006.01) |
| *H01L 23/525* | (2006.01) |

(52) U.S. Cl.
CPC ....... *H01L 23/528* (2013.01); *H01L 21/76802* (2013.01); *H01L 21/76816* (2013.01); *H01L 21/76877* (2013.01); *H01L 23/5226* (2013.01); *H01L 23/5329* (2013.01); *H01L 23/53295* (2013.01); *H01L 23/525* (2013.01); *H01L 2924/0002* (2013.01)

(58) Field of Classification Search
CPC ....... H01L 23/48; H01L 23/52; H01L 29/40; H01L 21/31053; H01L 21/4871
USPC ....................................... 257/759
See application file for complete search history.

(56) References Cited

U.S. PATENT DOCUMENTS

| | | |
|---|---|---|
| 2006/0292851 A1 | 12/2006 | Lin et al. |
| 2008/0308934 A1 | 12/2008 | Alvarado et al. |
| 2009/0140441 A1 | 6/2009 | Camacho et al. |
| 2010/0006988 A1* | 1/2010 | Tang ............... H01L 21/6835 257/659 |

(Continued)

FOREIGN PATENT DOCUMENTS

KR      20130134991 A      12/2013

*Primary Examiner* — Phuc Dang
(74) *Attorney, Agent, or Firm* — Slater Matsil, LLP

(57) ABSTRACT

An embodiment staggered via redistribution layer (RDL) for a package includes a first polymer layer supported by a metal via. The first polymer layer has a first polymer via. A first redistribution layer is disposed on the first polymer layer and within the first polymer via. The first redistribution layer is electrically coupled to the metal via. A second polymer layer is disposed on the first redistribution layer. The second polymer layer has a second polymer via laterally offset from the first polymer via. A second redistribution layer is disposed on the second polymer layer and within the second polymer via. The second redistribution layer is electrically coupled to the first redistribution layer.

20 Claims, 7 Drawing Sheets

(56) References Cited

U.S. PATENT DOCUMENTS

2011/0291288 A1* 12/2011 Wu .................. H01L 23/49827
257/774
2013/0134596 A1 5/2013 Hu et al.
2013/0313514 A1* 11/2013 Hwang .................. H01L 33/16
257/13
2013/0320522 A1* 12/2013 Lai .......................... H01L 24/05
257/737
2014/0110856 A1 4/2014 Lin

* cited by examiner

STAGGERED VIA REDISTRIBUTION LAYER (RDL) FOR A PACKAGE AND A METHOD FOR FORMING THE SAME

This application is continuation application of U.S. patent application Ser. No. 14/143,582, entitled "Staggered Via Redistribution Layer (RDL) for a Package and a Method for Forming the Same," filed on Dec. 30, 2013, which application is incorporated herein by reference

BACKGROUND

A redistribution layer, or simply an RDL, is used to maintain existing wafer level package designs while accommodating the smaller die produced by semiconductor manufacturers transitioning to advanced technology nodes.

The redistribution layer in a package may be formed by, for example, alternately patterning a polymer layer to form a polymer via and then plating the polymer via. The process may generally continue in this manner until a suitable number of redistribution layers have been produced within the package.

Unfortunately, each successive polymer via in the above process has a smaller width and a larger depth than the one before. Therefore, the polymer via layout pattern will demand a relatively large portion of the topography within the package in order to accommodate the size of the first polymer via formed, which is the largest. Also, because the depth of each successive polymer via increases relative to the one formed before, the uniformity of the critical dimension of the polymer via (e.g., the width of the polymer via at the bottom thereof) is much harder to control.

The polymer via layout pattern is also subject to polymer under developing, may induce high stress in the package, and may result in poor reliability for the package.

BRIEF DESCRIPTION OF THE DRAWINGS

For a more complete understanding of the present disclosure, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of the present embodiments are discussed in detail below. It should be appreciated, however, that the disclosure provides many applicable inventive concepts that can be embodied in a wide variety of specific contexts. The specific embodiments discussed are merely illustrative and do not limit the scope of the disclosure.

The present disclosure will be described with respect to embodiments in a specific context, namely a wafer level package with a multi-layer redistribution layer. The concepts in the disclosure may also apply, however, to other types of packages, interconnection assemblies, semiconductor structures, etc.

Figure 1:
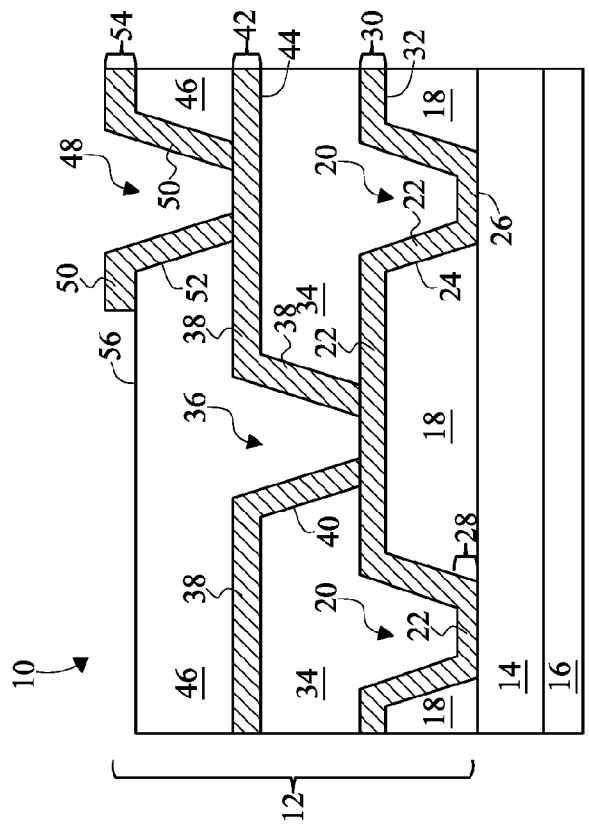
FIG. 1 illustrates a representative portion of an embodiment package 10 with a staggered via redistribution layer (RDL)

Referring now to FIG. 1, a portion of a package 10 with a staggered via redistribution layer (RDL) 12 is illustrated. As will be more fully explained below, the staggered via redistribution layer 12, which may also be referred to a multi-layer redistribution layer, provides the package 10 with numerous benefits. For example, staggered vias in the staggered via redistribution layer 12 occupy less space within the package 10 relative to stacked vias used in other approaches. Indeed, the polymer via layout pattern for "stacked" vias demands a relatively large portion of the space within the package in order to accommodate the size of the initial polymer via formed, which is the largest and which incorporates later formed vias. In order for the initial polymer via to incorporate the subsequently formed vias, the initial polymer via must be quite large in diameter. In contrast, because the staggered vias are laterally offset from one another the spacing issues are overcome. In other words, a staggered via from a staggered via layout will occupy less space than a stacked via in a stacked via layout. In addition, a depth of the staggered vias in the staggered via redistribution layer 12 is less than a depth of stacked vias. Therefore, the photolithography process used to generate the staggered vias may be performed without experiencing detrimental depth of focus (DOF) issues. Further, the staggered vias in the staggered via redistribution layer 12 promote critical dimension uniformity for the polymer vias, offer good reliability for the package 10, improve electromigration (EM) performance, and generate less stress in the package 10.

As shown in FIG. 1, the portion of the package 10 incorporating the staggered via redistribution layer 12 includes a metal via 14 supported by a metal pad 16. In an embodiment, the metal via 14 comprises copper and the metal pad 16 comprises aluminum. However, other suitable metals (e.g., tungsten, gold, silver, etc.) or alloys may be used for the metal via 14 and the metal pad 16.

Still referring to FIG. 1, at least a portion of a first polymer layer 18 is disposed over the metal via 14. In an embodiment, portions of the first polymer layer 18 are disposed on and abut against the underlying metal via 14. In an embodiment, the first polymer layer 18 is formed from polybenzoxazole (PBO). However, the first polymer layer 18 may also be formed from polyimide, another suitable polymer, or a dielectric.

As shown, the first polymer layer 18 includes first polymer vias 20. The first polymer vias 20 may be formed in the first polymer layer 18 by, for example, a photolithography process. While two of the first polymer vias 20 are depicted in the first polymer layer 18 in FIG. 1, more or fewer of the first polymer vias 20 may be formed in the first polymer layer 18. In an embodiment, a single first polymer via 20 is formed in the first polymer layer 18.

As shown in FIG. 1, a first redistribution layer 22 is disposed on the first polymer layer 18 and within the first polymer vias 20. In an embodiment, the first redistribution layer 22 extends along sidewalls 24 of the first polymer vias 20. In addition, the first redistribution layer 22 extends along a top surface 26 of the metal via 14. As such, the first redistribution layer 22 is electrically coupled to the metal via 14. In an embodiment, the first redistribution layer 22 contacts the metal pad 14 in more than one location to provide for improved electrical conductivity and to prevent issues associated with a high resistance due to lesser number of contacts. In an embodiment, the first redistribution layer 22 is formed from copper or another suitable metal. In an embodiment, a thickness 28 of the first redistribution layer 22 at the bottom of the first polymer via 20 and abutting the top surface 26 of the metal via 14 is the same as, or equivalent to, a thickness 30 of the first redistribution layer 22 extending along a top surface 32 of the first polymer layer 18. In an embodiment, a plating solvent is applied under predetermined plating conditions to form the first redistribution layer 22. As an example, the plating conditions may be: a temperature of 25° C., a removal rate of 0.2 μm per minute for a time of 10 minutes, and a target plating thickness of approximately 2.1 μm.

Still referring to FIG. 1, a second polymer layer 34 is disposed on the first redistribution layer 22. In an embodiment, portions of the second polymer layer 34 are disposed within and occupy a portion of the first polymer vias 20 in the underlying first polymer layer 18. In an embodiment, the second polymer layer 34 is formed from polybenzoxazole (PBO). However, the second polymer layer 34 may also be formed from polyimide, another suitable polymer, or a dielectric.

As shown, the second polymer layer 34 includes a second polymer via 36. The second polymer via 36 in the second polymer layer 34 is generally laterally offset relative to the first polymer vias 20 in the first polymer layer 18. In other words, the second polymer via 36 in the second polymer layer 34 and the first polymer vias 20 in the first polymer layer 18 are staggered. As shown in FIG. 1, in an embodiment, the second polymer via 36 in second polymer layer 34 is disposed over the first polymer layer 18 and between the first polymer vias 20 in the first polymer layer 18.

The second polymer via 36 in the second polymer layer 34 may be formed by, for example, a photolithography process. While a single second polymer via 36 is depicted in the second polymer layer 34 in FIG. 1, more of the second polymer vias 36 may be formed in the second polymer layer 34. As will be more fully explained below, additional second polymer vias 36 in the second polymer layer 34 will also be staggered from, or offset relative to, the first polymer vias 20 in the first polymer layer 18.

Still referring to FIG. 1, a second redistribution layer 38 is disposed on the second polymer layer 34 and within the second polymer via 36. In an embodiment, the second redistribution layer 38 extends along sidewalls 40 of the second polymer via 36. The second redistribution layer 38 is also electrically coupled to the first redistribution layer 22. In an embodiment, the second redistribution layer 38 is formed from copper or another suitable metal. In an embodiment, the thickness 30 of the second redistribution layer 38 at the bottom of the second polymer via 36 and abutting the top surface 32 of the first polymer layer 18 is the same as, or equivalent to, a thickness 42 of the second redistribution layer 38 extending along the top surface 44 of the second polymer layer 34.

A third polymer layer 46 is disposed on the second redistribution layer 38. In an embodiment, portions of the third polymer layer 46 are disposed within and occupy a portion of the second polymer via 36 in the underlying second polymer layer 34. In an embodiment, the third polymer layer 46 is formed from polybenzoxazole (PBO). However, the third polymer layer 46 may also be formed from polyimide, another suitable polymer, or a dielectric.

As shown, the third polymer layer 46 includes a third polymer via 48. The third polymer via 48 in the third polymer layer 46 is generally laterally offset relative to the second polymer via 36 in the second polymer layer 34. In other words, the third polymer via 48 in the third polymer layer 46 and the second polymer via 36 in the second polymer layer 34 are staggered. In an embodiment, the third polymer via 48 in the third polymer layer 46 is vertically aligned with an underlying first polymer via 20 in the first polymer layer 18 as shown in FIG. 1. In an embodiment and as will be more fully explained below, a vertical centerline of the third polymer via 48 in the third polymer layer 46 may be slightly offset from a vertical centerline of the underlying first polymer via 20 in the first polymer layer 18 by, for example, about 1 μm.

The third polymer via 48 in the third polymer layer 46 may be formed by, for example, a photolithography process. While a single third polymer via 48 is depicted in the third polymer layer 46 in FIG. 1, more of the third polymer vias 48 may be formed in the third polymer layer 46. As will be more fully explained below, additional third polymer vias 48 in the third polymer layer 46 will also be staggered from, or offset relative to, the second polymer vias 36 in the second polymer layer 34 but may be aligned with one of the first polymer vias 20 in the first polymer layer 18.

As shown in FIG. 1, a third redistribution layer 50 is disposed on the third polymer layer 46 and within the third polymer via 48. In an embodiment, the third redistribution layer 50 extends along sidewalls 52 of the third polymer via 48. The third redistribution layer 50 is also electrically coupled to the second redistribution layer 38. In an embodiment, the third redistribution layer 50 is formed from copper or another suitable metal. In an embodiment, the thickness 42 of the third redistribution layer 50 at the bottom of the third polymer via 48 and abutting the top surface 44 of the second polymer layer 34 is the same as, or equivalent to, a thickness 54 of the third redistribution layer 50 extending along a top surface 56 of the third polymer layer 46.

In various embodiments, further polymer layers including polymer vias and further redistribution layers may be formed within the package 10 in addition to those shown in FIG. 1. Indeed, the formation of staggered polymer vias in additional polymer layers may continue until a suitable or desired fan-out pattern or layout is achieved for the package 10. For example, the staggered polymer vias may be employed to enlarge the pitch of the package. In other words, the small pitch of the package may be converted to a larger pitch such that the package may be suitable to be electrically coupled to another device.

Figure 2:
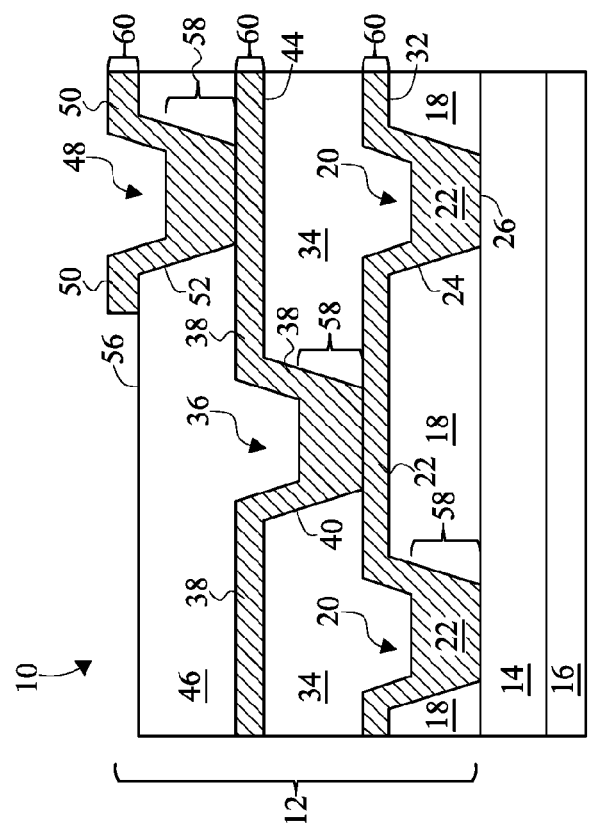
FIG. 2 illustrates a representative portion of an embodiment package 10 with a staggered via redistribution layer (RDL) in another embodiment.

Referring now to FIG. 2, a portion of a package 10 with a staggered via redistribution layer (RDL) 12 in another embodiment is illustrated. As shown in FIG. 2, a thickness 58 of the first, second, and third redistribution layers 22, 38, 50 within the polymer vias 20, 36, 48 is greater than a thickness 60 of the first, second, and third redistribution layers 22, 38, 50 extending along the top surface 32, 44, 56 of the first, second, and third polymer layers 18, 34, 46.

In an embodiment, the thickness 58 of the first, second, and third redistribution layers 22, 38, 50 within the polymer vias 20, 36, 48 may be increased relative to other areas within the package 10 by using a suitable plating solvent. For example, in an embodiment a plating solvent comprising 40-60-0.05 g/L for Cu—$H_2SO_4$—Cl and 3-10-5 ml/L for A1-S1-L1A, where A1, S1, and L1A are different additives.

Figure 3:
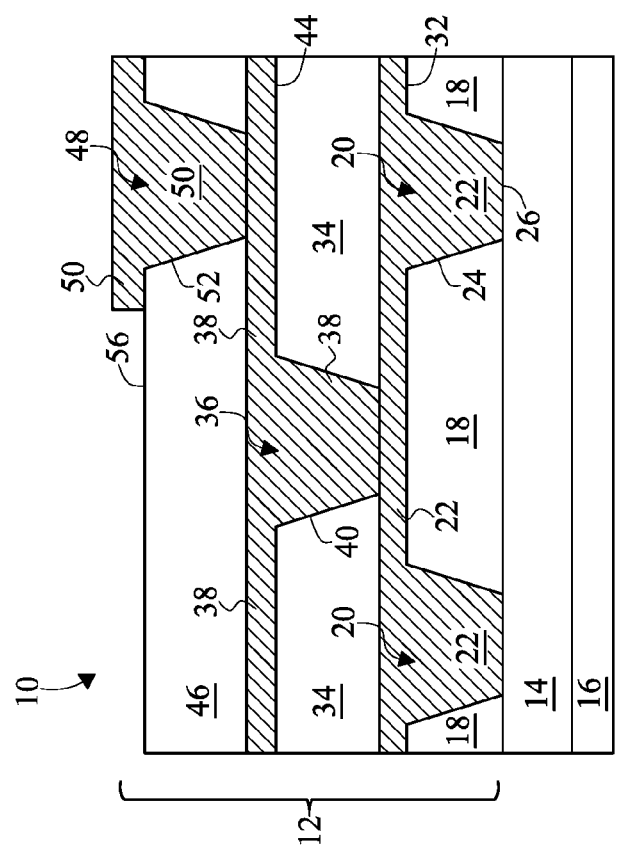
FIG. 3 illustrates a representative portion of an embodiment package 10 with a staggered via redistribution layer (RDL) in another embodiment.

Referring now to FIG. 3, a portion of a package 10 with a staggered via redistribution layer (RDL) 12 in another embodiment is illustrated. As shown in FIG. 3, the first, second, and third redistribution layers 22, 38, 50 entirely occupy the polymer vias 20, 36, 48 in the first, second, and third polymer layers 18, 34, 46. As such, the top surface of each redistribution layer is generally planar except where engaged with another redistribution layer. Moreover, the polymer vias 20, 36, 48 are solid metal structures.

In an embodiment, the first, second, and third redistribution layers 22, 38, 50 that entirely occupy the polymer vias 20, 36, 48 in the first, second, and third polymer layers 18, 34, 46, the ratio of the Cu—$H_2SO_4$—Cl and A1-S1-L1A in the plating solvent is adjusted or suitably modified.

Figure 4:
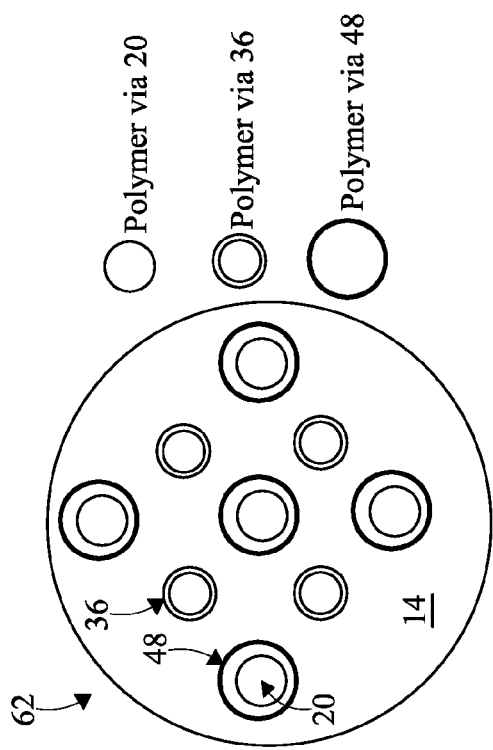
FIG. 4 illustrates a top view of an embodiment polymer via layout pattern.

Referring now to FIG. 4, a polymer via layout pattern 62 on top of the metal via 14 is illustrated. As shown, the polymer vias 20, 48 from the first and third polymer layers 18, 46 (see FIG. 1) are vertically aligned with each other and are offset or spaced apart from the second polymer vias 36 from the second polymer layer 34. As shown in FIG. 4, each of the polymer vias 20, 36, 48 generally resides within the boundary of the circular metal via 14.

Figure 5:
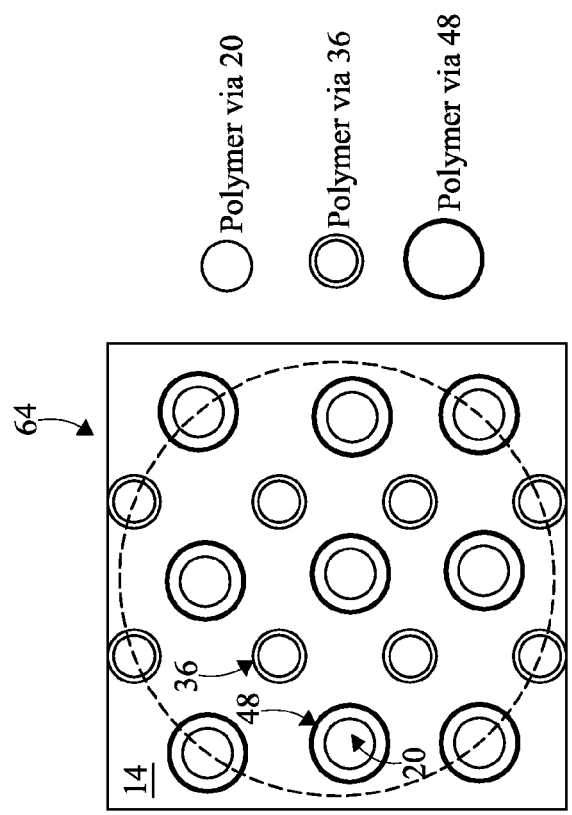
FIG. 5 illustrates a top view of another embodiment polymer via layout pattern.

Referring now to FIG. 5, a polymer via layout pattern 64 in another embodiment is illustrated. As shown, the polymer vias 20, 48 from the first and third polymer layers 18, 46 (see FIG. 1) are vertically aligned with each other and are offset or spaced apart from the second polymer vias 36 from the second polymer layer 34. As shown in FIG. 5, some of the polymer vias 20, 36, 48 reside within the boundary of the square metal via 14, but would overlap the boundary if the metal via 14 was circular in shape as depicted in FIG. 4.

Figure 6:
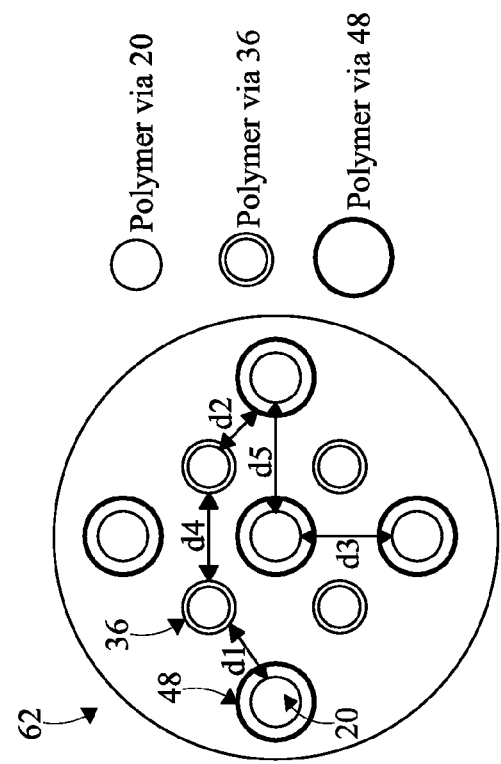
FIG. 6 illustrates the embodiment polymer via layout pattern of FIG. 5 with dimension lines added.

Referring now to FIG. 6, the polymer via layout pattern 62 of FIG. 4 has been augmented to include dimension lines. As will be more fully explained below, the distances disclosed herein were selected to ensure that adjacent vias do not undesirably contact each other. For example, a via may have a profile that is not vertical (i.e., the via has a taper angle of around fifty-two degrees), the bottom of one via may contact the top of an adjacent via unless sufficient space is provided between the vias. In other words, the adjacent vias may undesirably merge together if too little space is allotted between them. In an embodiment, a distance d1 between the first polymer vias 20 and the second polymer vias 36 is about 3 μm. In an embodiment, a distance d2 between the second polymer vias 36 and the third polymer vias 48 is about 3 μm.

Still referring to FIG. 6, in an embodiment a distance d3 between any two of the first polymer vias 20 is greater than about 4 μm. In an embodiment, a distance d4 between any two of the second polymer vias 36 is greater than about 4 μm. In addition, in an embodiment, a distance d5 between any two of the third polymer vias 48 is greater than about 6 μm.

Figure 7:
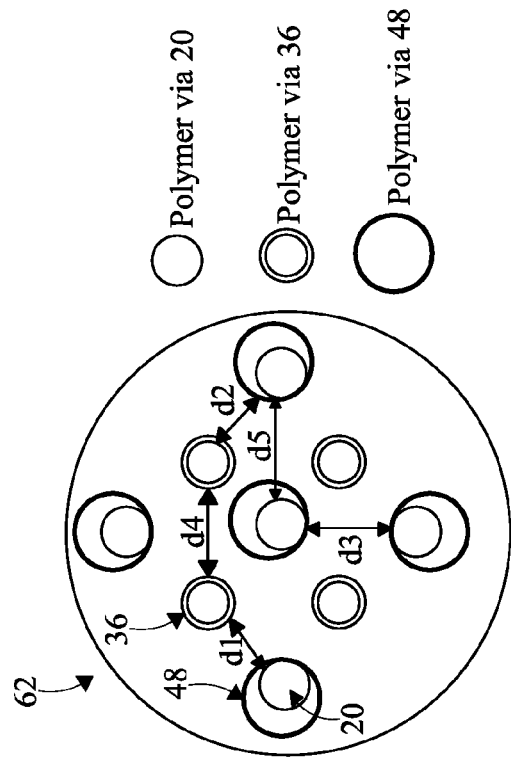
FIG. 7 illustrates another embodiment polymer via layout pattern with dimension lines added.

In an embodiment, if the distance d3 is greater than about 6 μm, then the center point of the first polymer vias 20 and the center point of the third polymer vias 48 may be the same as shown in FIG. 6. In other words, the first polymer vias 20 are vertically aligned with the third polymer vias 48 as shown in FIG. 1. In an embodiment, if the distance d3 is between about 4 μm and about 6 μm, then the center point of the third polymer vias 48 may be shifted by about 1 μm relative to the center point of the first polymer vias 20 as shown in FIG. 7.

Figure 10:
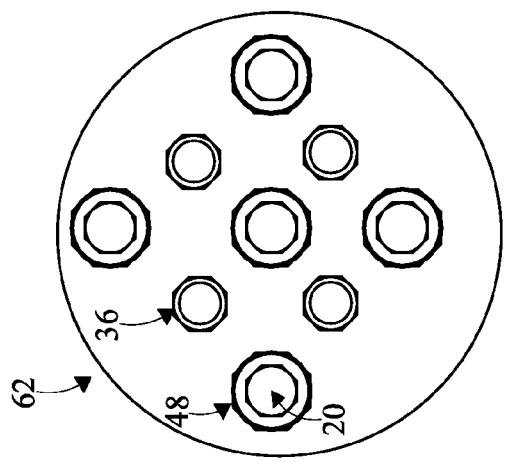
FIGS. 8-10 illustrate embodiment polymer layout patterns including polymer vias of varying shapes.
Figure 9:
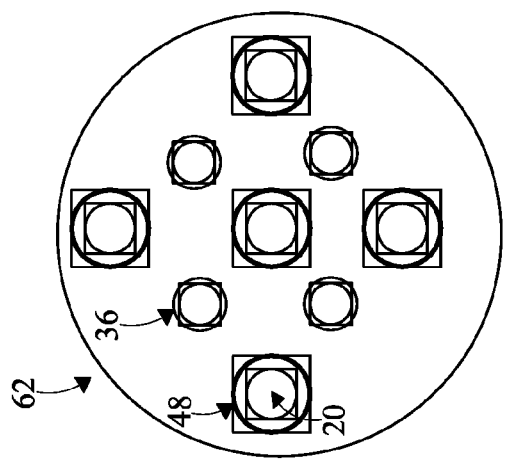
Figure 8:
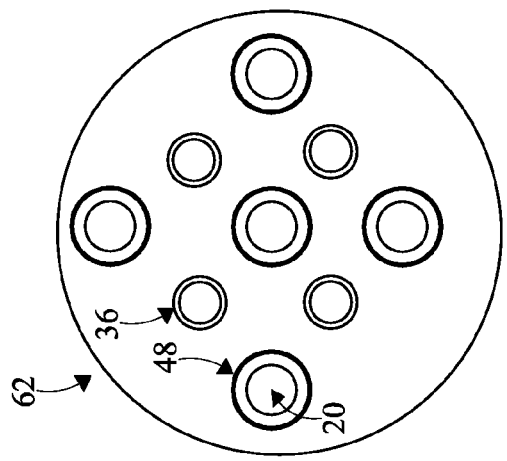

Referring now to FIG. 8, in an embodiment one or more of the polymer vias 20, 36, 48 in the polymer via layout pattern 62 may be in the shape of a circle. As shown in FIG. 9, in an embodiment one or more of the polymer vias 20, 36, 48 in the polymer via layout pattern 62 may be in the shape of a square. As shown in FIG. 10, in an embodiment one or more of the polymer vias 20, 36, 48 in the polymer via layout pattern 62 may be in the shape of an octagon.

Figure 11:
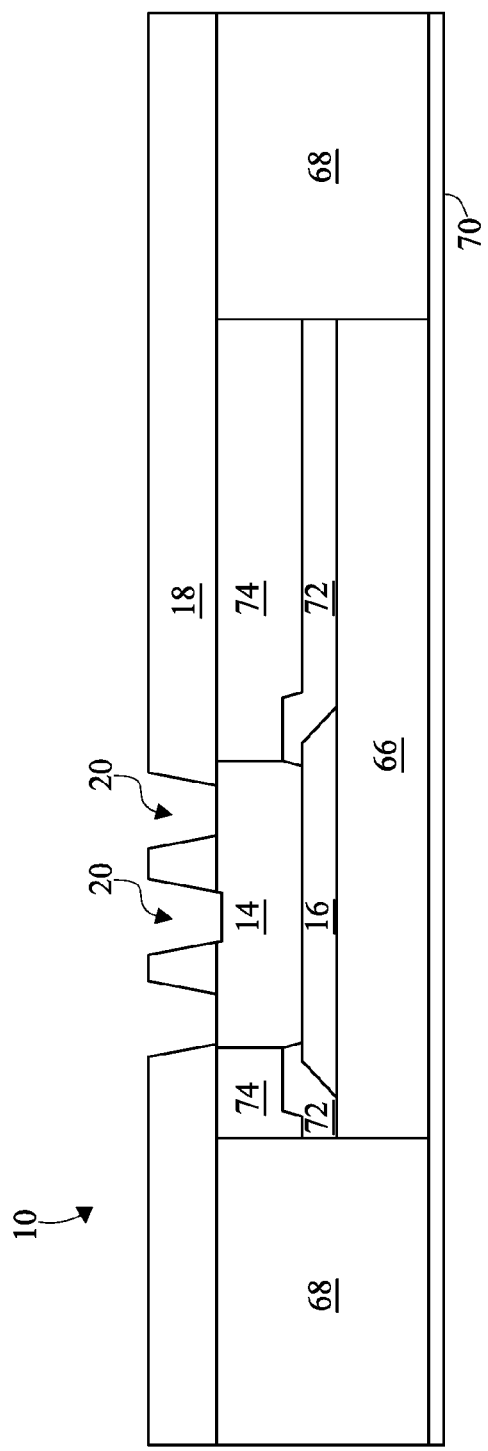
FIG. 11 illustrates an embodiment package suitable for use with the redistribution layers illustrated in FIGS. 1-3.

Referring now to FIG. 11, the package 10 that may include and benefit from the staggered via redistribution layer 12 of FIGS. 1-3 is illustrated in further detail. As shown, the package 10 includes a silicon-containing or silicon substrate 66 and a molding compound 68 disposed over a die attach film (DAF) 70. The silicon substrate 66 is generally disposed beneath the metal pad 16.

In an embodiment, the metal pad 16 and a lower portion of the metal via 14 are embedded in a passivation layer 72. In addition, an upper portion of the metal via 14 is embedded in a polymer layer 74 disposed over the passivation layer 72. In an embodiment, the top surfaces of the molding compound 68, the polymer layer 74, and the metal via 14 are co-planar.

Still referring to FIG. 11, the first polymer layer 18 forming a part of the staggered redistribution layer 12 as shown in FIGS. 1-3 is depicted. In some embodiments, the first polymer layer 18 includes several of the first polymer vias 20 situated over the metal via 14. Once the first polymer vias 20 have been formed in the first polymer layer 18, the remaining portions of the staggered redistribution layer 12 shown in FIGS. 1-3 may be formed as described above.

Figure 12:
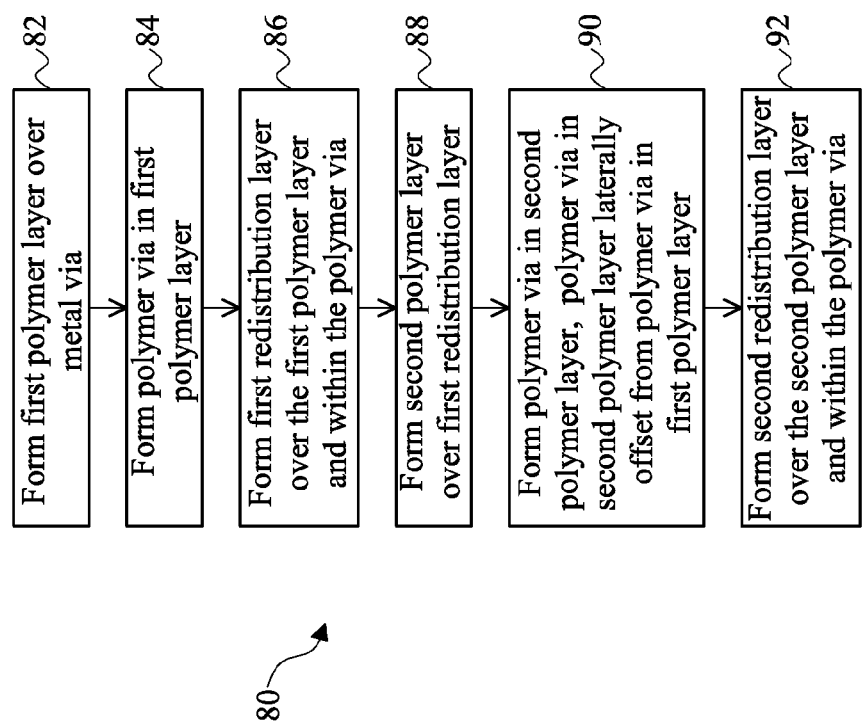
FIG. 12 illustrates an embodiment method of forming the staggered via redistribution layer for an embodiment package.

Referring now to FIG. 12, an embodiment method 80 of forming the staggered via redistribution layer 12 for the package 10 is illustrated. In block 82, a first polymer layer 18 is formed over a metal via 14. In block 84, a polymer via 20 is formed in the first polymer layer 18. In an embodiment, the polymer via 20 is formed through a lithography process. In block 86, a first redistribution layer 22 is formed on the first polymer layer 18 and within the polymer via 20. The first redistribution layer 22 is electrically coupled to the metal via 14. In an embodiment, the thickness 28 or profile of the first redistribution layer 22 may be modified using a solvent, by etching, by grinding, etc.

In block 88, a second polymer layer 34 is formed on the first redistribution layer 22. In block 90, a polymer via 36 is formed in the second polymer layer 34 such that the polymer via 36 in the second polymer layer 34 is laterally offset from the first polymer via 20. In an embodiment, the polymer via 36 is formed through a lithography process. In block 92, a second redistribution layer 38 is formed on the second polymer layer 34 and within the polymer via 36. The second redistribution layer 38 is electrically coupled to the first redistribution layer 22. In an embodiment, the thickness 42 or profile of the second redistribution layer 38 may be modified using a solvent, by etching, by grinding, etc.

The deposition of polymer layers, formation of polymer vias, and plating to form redistribution layers may be continued until a sufficient staggered redistribution layer for the package has been formed. For example, the staggered polymer vias may be employed to enlarge the pitch of the package. In other words, the small pitch of the package may be converted to a larger pitch such that the package may be suitable to be electrically coupled to another device. In some embodiments the method 80 of forming the staggered via redistribution layer for the package may include additional steps or processes that have been omitted for the sake of brevity.

From the foregoing, those of ordinary skill in the art will recognize that staggered via redistribution layer provides the package with numerous benefits such as those discussed above. These benefits and advantages are possible due to the staggered arrangement of the vias instead of the stacked arrangement used in other approaches. In other words, because the vias 36 in the polymer layer 34 are offset from the vias 20 in the polymer layer 18 and the vias 48 in the polymer layer 46, the benefits and advantages identified herein may be achieved.

An embodiment staggered via redistribution layer (RDL) for a package includes a first polymer layer disposed over a metal via. The first polymer layer has a first polymer via. A first redistribution layer is disposed on the first polymer layer and within the first polymer via. The first redistribution layer is electrically coupled to the metal via. A second polymer layer is disposed on the first redistribution layer. The second polymer layer has a second polymer via laterally offset from the first polymer via. A second redistribution layer is disposed on the second polymer layer and within the second polymer via. The second redistribution layer is electrically coupled to the first redistribution layer.

An embodiment staggered via redistribution layer (RDL) for a package includes a first polymer layer disposed over a metal via. The first polymer layer has a first polymer via and a second polymer via. A first redistribution layer is disposed on the first polymer layer and within the first polymer via and the second polymer via. The first redistribution layer is electrically coupled to the metal via. A second polymer layer is disposed on the first redistribution layer. The second polymer layer has a third polymer via and a fourth polymer via. The third polymer via is disposed over the first polymer layer and between the first polymer via and the second polymer via. A second redistribution layer is disposed on the second polymer layer and within the third polymer via and the fourth polymer via. The second redistribution layer is electrically coupled to the first redistribution layer. A third polymer layer is disposed on the second redistribution layer. The third polymer layer has a fifth polymer via and a sixth polymer via. The fifth polymer via and the sixth polymer via are laterally offset from the third polymer via. A third redistribution layer is disposed on the third polymer layer and within the third polymer via and the fourth polymer via. The third redistribution layer is electrically coupled to the second redistribution layer.

An embodiment method of forming a staggered via redistribution layer (RDL) for a package is provided. The method includes forming a first polymer layer over a metal via. The first polymer layer has a first polymer via. The method also includes forming a first redistribution layer on the first polymer layer and within the first polymer via. The first redistribution layer is electrically coupled to the metal via. The method includes forming a second polymer layer on the first redistribution layer. The second polymer layer has a second polymer via laterally offset from the first polymer via. The method also includes forming a second redistribution layer on the second polymer layer and within the second polymer via. The second redistribution layer is electrically coupled to the first redistribution layer. The method includes forming a third polymer layer on the second redistribution layer. The third polymer layer has a third polymer via laterally offset from the second polymer via. The method also includes forming a third redistribution layer on the third polymer layer and within the third polymer via. The third redistribution layer is electrically coupled to the second redistribution layer.

In an embodiment, a method of forming a semiconductor device is provided, including forming a first insulating layer over a conductive via, the first insulating layer having a first plurality of openings exposing the conductive via, and forming a first conductive line extending through the plurality of openings to the conductive via, the first conductive line extending over the first insulating layer between adjacent ones of the first plurality of openings. A second insulating layer is formed over the first conductive line, the second insulating layer having a first opening exposing the first conductive line, the first opening being interposed between adjacent ones of the first plurality of openings in a plan view, and a second conductive line is formed extending through the first opening to the first conductive line.

In an embodiment, a method of forming a semiconductor device is provided, including forming a first insulating layer over a conductive feature, forming a first plurality of openings in the first insulating layer, the first plurality of openings exposing the conductive feature, and forming a first conductive layer over the first insulating layer, the first conductive layer extending through the first plurality of openings forming a first plurality of conductive vias to the conductive feature. A second insulating layer is formed over the first conductive layer, and a second plurality of openings is formed in the second insulating layer, the second plurality of openings exposing the first conductive layer. A second conductive layer is formed over the second insulating layer, the second conductive layer extending through the second plurality of openings to the first conductive layer forming a second plurality of conductive vias, none of the second plurality of openings overlying the first plurality of openings in a plan view.

In an embodiment, a semiconductor device is provided, including a first insulating layer disposed over a conductive feature and a first conductive layer over the first insulating layer, the first conductive layer having a first plurality of conductive vias extending through the first insulating layer to the conductive feature. A second insulating layer is disposed over the first conductive layer, and a second conductive layer over the second insulating layer, the second conductive layer having a second plurality of conductive vias extending through the second insulating layer to the first conductive layer, wherein none of the first plurality of conductive vias laterally overlap any of the second plurality of conductive vias.

While the disclosure provides illustrative embodiments, this description is not intended to be construed in a limiting sense. Various modifications and combinations of the illustrative embodiments, as well as other embodiments, will be apparent to persons of ordinary skill in the art upon reference to the description. It is therefore intended that the appended claims encompass any such modifications or embodiments.

What is claimed is:

1. A method of forming a semiconductor device, the method comprising:
   forming a first insulating layer over a conductive via, the first insulating layer having a first plurality of openings exposing the conductive via, wherein the conductive via is a single conductive element;
   forming a first conductive line extending through the first plurality of openings to the conductive via, the first conductive line extending over the first insulating layer between adjacent ones of the first plurality of openings;

forming a second insulating layer over the first conductive line, the second insulating layer having a first opening exposing the first conductive line, the first opening being interposed between adjacent ones of the first plurality of openings in a plan view; and forming a second conductive line extending through the first opening to the first conductive line.

2. The method of claim 1, wherein forming the first insulating layer comprises forming a polymer layer.

3. The method of claim 1, further comprising:

forming a third insulating layer on the second conductive line, the third insulating layer having a second plurality of openings, the second plurality of openings exposing the second conductive line; and forming a third conductive line on the third insulating layer, the third insulating layer extending through the second plurality of openings in the third insulating layer.

4. The method of claim 3, wherein the second plurality of openings are laterally above the conductive via.

5. The method of claim 3, wherein the second plurality of openings are laterally above respective ones of the first plurality of openings.

6. The method of claim 3, further comprising offsetting a center of each the second plurality of openings relative to a center of respective ones of the first plurality of openings by about 1 µm.

7. The method of claim 1, wherein forming the second insulating layer further comprises forming a second opening exposing the first conductive line.

8. The method of claim 7, wherein a distance between the first opening and the second opening is greater than about 4 µm.

9. The method of claim 8, wherein a distance between adjacent ones of the first plurality of openings is greater than about 4 µm.

10. A method of forming semiconductor device, the method comprising:

forming a first insulating layer over a conductive feature;

forming a first plurality of openings in the first insulating layer, the first plurality of openings exposing the conductive feature;

forming a first conductive layer over the first insulating layer, the first conductive layer extending through the first plurality of openings forming a first plurality of conductive vias to the conductive feature, the conductive feature extending continuously to each of the first plurality of conductive vias;

forming a second insulating layer over the first conductive layer;

forming a second plurality of openings in the second insulating layer, the second plurality of openings exposing the first conductive layer; and forming a second conductive layer over the second insulating layer, the second conductive layer extending through the second plurality of openings to the first conductive layer forming a second plurality of conductive vias, none of the second plurality of openings overlying the first plurality of openings in a plan view.

11. The method of claim 10, wherein the conductive feature comprises a conductive via in a substrate and further comprising:

forming a molding compound along sidewalls of the substrate.

12. The method of claim 10, wherein each of the second plurality of openings is formed over the first insulating layer.

13. The method of claim 10, wherein a portion of the second conductive layer along the first conductive layer is thicker than a portion of the second conductive layer along a surface of the second insulating layer.

14. The method of claim 10, wherein forming the second conductive layer comprises completely filling the second plurality of openings.

15. A semiconductor device comprising:

a first insulating layer disposed over a conductive feature, a surface of the conductive feature being a single continuous surface;

a first conductive layer over the first insulating layer, the first conductive layer having a first plurality of conductive vias extending through the first insulating layer to the surface of the conductive feature;

a second insulating layer disposed over the first conductive layer; and a second conductive layer over the second insulating layer, the second conductive layer having a second plurality of conductive vias extending through the second insulating layer to the first conductive layer;

wherein none of the first plurality of conductive vias laterally overlap any of the second plurality of conductive vias.

16. The semiconductor device of claim 15, wherein a first conductive via of the second plurality of conductive vias is laterally interposed between select ones of the first plurality of conductive vias.

17. The semiconductor device of claim 15, further comprising:

a third insulating layer on the second conductive layer; and a third conductive layer on the third insulating layer, the third conductive layer having a third plurality of conductive vias extending through the third insulating layer to the second conductive layer.

18. The semiconductor device of claim 15, wherein a distance between a first conductive via of the first plurality of conductive vias and a second conductive via of the second plurality of conductive vias is about 3 µm.

19. The semiconductor device of claim 15, wherein a distance between adjacent ones of the first plurality of conductive vias is greater than about 4 µm.

20. The semiconductor device of claim 15, wherein a portion of the second conductive layer along the first conductive layer is thicker than a portion of the second conductive layer along a surface of the second insulating layer.

* * * * *